July 18, 1961 H. DORENDORF 2,993,126

FILAMENTARY SEMICONDUCTOR DEVICE

Filed Nov. 7, 1956 2 Sheets-Sheet 1

Inventor
Heinz Dorendorf
By [signature]
att'y.

July 18, 1961 H. DORENDORF 2,993,126

FILAMENTARY SEMICONDUCTOR DEVICE

Filed Nov. 7, 1956 2 Sheets-Sheet 2

Inventor
Heinz Dorendorf
By [signature] Att'y.

United States Patent Office 2,993,126

Patented July 18, 1961

2,993,126

FILAMENTARY SEMICONDUCTOR DEVICE

Heinz Dorendorf, Munich, Germany, assignor to Siemens & Halske Aktiengesellschaft Berlin and Munich, a corporation of Germany Filed Nov. 7, 1956, Ser. No. 620,930
Claims priority, application Germany Nov. 12, 1955
21 Claims. (Cl. 307—88.5)

The present invention relates to a filamentary semiconductor device comprising a semiconductor body, preferably a semiconductor monocrystal, which is provided at each of two places, located relatively far apart, with a barrier-free base terminal between which there is arranged on the semiconductor crystal surface, at least one blocking emitter electrode, and if desired at least one blocking collector electrode. Such semiconductor devices have been designated in the literature as double-base diodes or double-base transistors and have up to the present time found use particularly as switching elements. In the known devices, the semiconductor crystal has in general an elongated bar-shape of constant cross-section, the size of which is generally between 1 and 0.2 square millimeter. With a bar length of 4 mm. the connect (On) and disconnect (Off) times are on the order of magnitude of about 5 to 15 $\mu$sec.

The object of the invention is to shorten the switching time of such a filamentary semiconductor device. In accordance with the invention this is accomplished by forming the semiconductor body and/or the base electrodes so as to exert an accelerating action on the charge carriers in the sense of the voltage drop. This can be effected for instance by the provision of two base electrodes of different size and/or shape. Similar results may be obtained by reducing the cross-section of the semiconductor bar from the one base to the other, the decrease in the cross-sectional size varying in accordance with a given function, for instance a linear or exponential function.

The various objects and features of the invention will appear from the description which will be rendered below with reference to the accompanying drawings, wherein.

Figure 2:
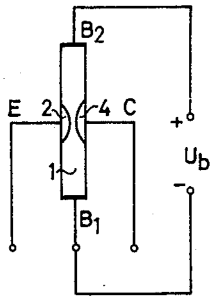
FIG. 2 illustrates the use of a double-base diode in a known trigger circuit.
Figure 3A:
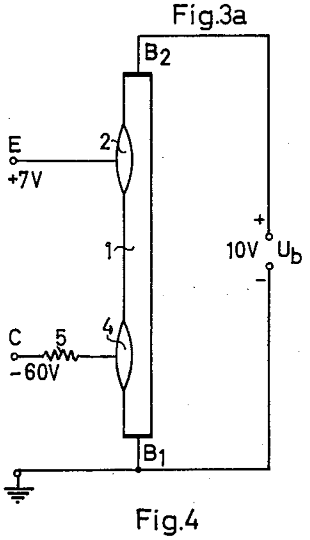
Figure 3B:
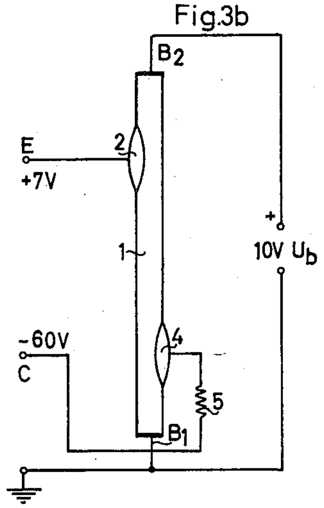
Figure 4:
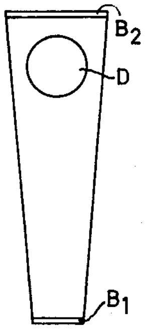
Figure 4A:
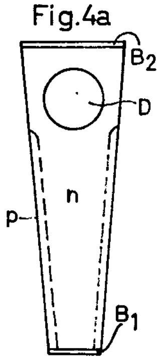
Figure 5A:
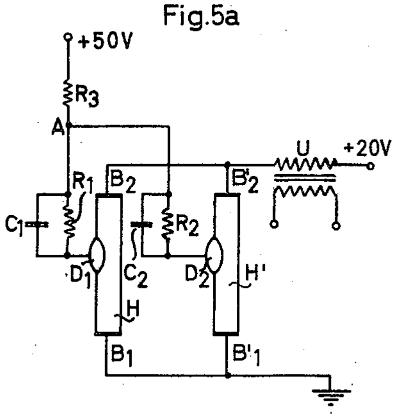
Figure 5B:
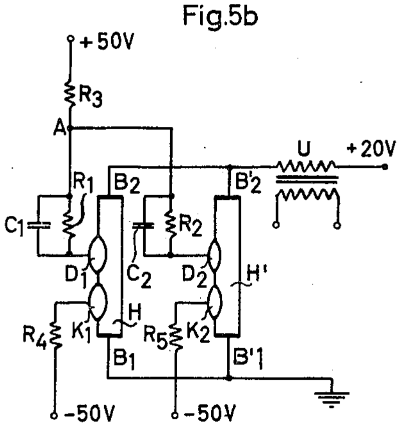
Figure 6:
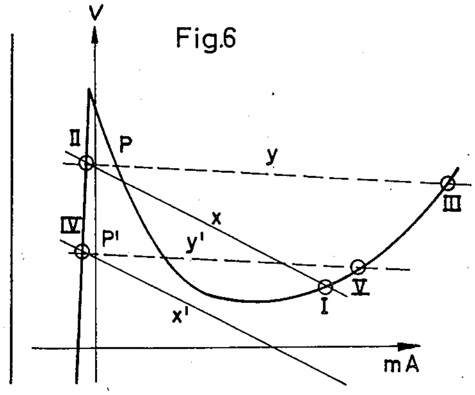
Figure 7A:
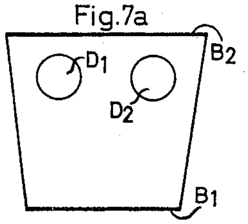
Figure 7B:
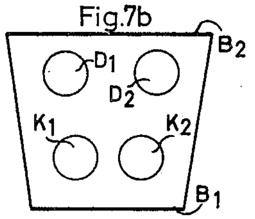
Figure 8A:
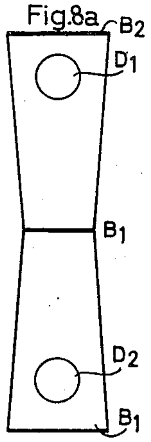
Figure 8B:
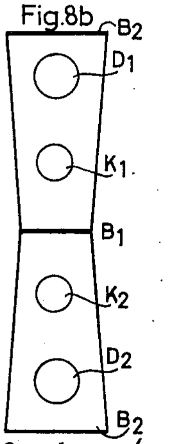

FIGS. 3*a* and 3*b* indicate double-base transistor circuit operating substantially in the manner of the circuit shown in FIG. 2;

FIGS. 4 and 4*a* show the configuration of the semiconductor body according to the invention;

FIGS. 5*a* and 5*b* show circuits in which the invention may be used;

FIG. 6 is a graph showing current curves; and

FIGS. 7*a* to 8*b* show further forms of the semiconductor body according to the invention.

Figure 1:
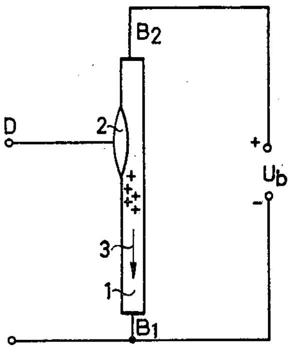
FIG. 1 shows an embodiment of a filamentary semiconductor device according to the invention.

In FIG. 1, 1 is a bar-shaped semiconductor crystal consisting of a suitable semiconductor material, for instance germanium, silicon or a corresponding alloy of elements of the same group as silicon or of elements of the third and fifth, fourth and sixth or second and seventh groups of the periodic system of elements or multiple compounds of these elements or compounds. $B_1$ and $B_2$ are two barrier-free base electrodes. D is part of a p-n junction 2 produced by alloying and/or diffusion and connected as emitter electrode. From FIG. 4 it can be seen that the base electrode $B_2$ which is closer to the emitter D has a greater cross-section than the other base electrode $B_1$. Furthermore, the cross-section of the semiconductor bar tapers down from the base electrode $B_2$ to the base electrode $B_1$ linearly, that is, in the sense of the voltage drop, due to which the charge carriers move from the emitter electrode D to the base $B_1$.

In accordance with the embodiment, the cross-section of the bar at the end of the base electrode $B_2$ is 1 x 0.2 mm.$^2$ while the cross-section at the end of the base electrode $B_1$ is 0.3 x 0.2 mm.$^2$ This results first of all in the advantage that the voltage drop between the emitter electrode D and the base electrode $B_1$ is increased at the expense of the voltage drop between D and $B_2$. Furthermore, due to the small cross-sectional area of the semiconductor bar between D and $B_1$ as compared with the larger cross-sectional area between D and $B_2$, a high field strength can be maintained over the distance between D and $B_1$ and nevertheless the p-n junction at D can be developed with a relatively large area. Another advantage is that the injected minority carriers between D and $B_1$, due to the cross-sectional gradient, have at all places approximately constant current density. On the other hand, due to the smaller current density at the base terminal $B_2$, an injurious injection of minority carriers is avoided there.

Each of the above-mentioned features, namely, the geometrical tapering of the cross-section off the electric field, the current density, and the carrier injection causes a shortening of the connect and disconnect times which in the embodiment described amounts to about 1 $\mu$sec. as compared with the otherwise customary times of 5 to 15 $\mu$sec. in case of uniform cross-section. In addition, there results an increase of the voltage difference at the emitter between the "On" and "Off" positions.

Corresponding effects are also provided by the invention in connection with a filamentary transistor having an additional collector between the emitter electrode D and base $B_1$. With the same advantage, the features of the invention may also be applied to filamentary semiconductor devices comprising a plurality of emitter electrodes and if desired collector electrodes arranged alongside of each other and/or behind each other between the two base terminals $B_1$ and $B_2$.

The embodiment described may be modified in various ways. In particular, the electric field effect which causes the acceleration of the charge carriers may be produced in a different manner, either instead of the means described or in addition thereto. For instance, the base electrodes may be given particular geometrical shape. For this purpose there may for instance also be provided at certain suitable places of the semiconductor surface, preferably along the tapering jacket or the tapering edges of the semiconductor body between D and $B_1$, corresponding surface conditions, in particular by suitable surface coatings. In particular there is contemplated in this connection providing, right below the surface, a p-n layer which surrounds the entire charge-carrier path and is connected for instance as collector.

The accelerating effects may also be produced by causing a drift effect by means of a doping gradient which is maintained on the charge-carrier path and in its direction. In this connection the strongest doping is to be effected particularly at the emitter place and the weakest doping in the vicinity of the base $B_1$ or in the vicinity of the collector electrodes to be provided. The different dopings can either have a continuous course, for instance distributed in accordance with an exponential law, or else be stepped. The difference between the highest and lowest dopings should preferably amount to at least one or two orders of magnitude.

Another possibility resides in using semiconductor material of different band width; the band width from the emitter to the collector or to the base may thereby be either stepped or continuously varied. This may be achieved in particularly simple manner by using alloys of semiconductor material having a corresponding non-uniform composition. One example of this is an alloy of silicon and germanium in which the ratio of the two components experiences a continuous or stepped change from the emitter to the collector or to the base.

It may also be mentioned that the geometrical tapering of the semiconductor body which takes place continuously in the embodiment shown in FIG. 1, could also be developed stepped.

The features in accordance with the invention may be advantageously used in known and in previously proposed filamentary transistor devices predominantly for switching purposes, for counting members, for frequency multiplication, etc. In this connection may also be mentioned filamentary transistor devices having several, for instance 10 emitters and a corresponding number of stable operating points, for use as decade counting and storing members.

The invention may however also be used in different manner. It is known, that a double-base diode can be used as switching member; it is already being used as triggering member in various trigger circuits, for instance in sawtooth oscillators, multivibrators or pulse regenerators. Its manner of operation will again be briefly explained with reference to FIG. 1.

In FIG. 1, 1 is a bar-shaped semiconductor monocrystal of germanium or preferably of silicon or of such a semiconductive compound of elements of the fourth group, or elements of the third and fifth or second and sixth or first and seventh groups of the periodic system or their multiple compounds or mixed crystals which have the least possible frictional resistance to the motion of the charge carriers and accordingly provide for sufficient life of the charge carriers. $B_1$ and $B_2$ are two base terminals. 2 is an electrode which forms a p-n junction with the semiconductor material. Let us assume that the semiconductor bar 1 is n-conductive and that the electrode 2 consists of indium. A direct voltage $U_b$ is applied to the two base terminals $B_1$ and $B_2$. The electrode 2 acts as control member with terminal D. Between D and $B_1$ characteristics are measured with a region of dropping characteristic. If D is negatively or weakly positively biased with respect to $B_1$, the p-n junction lies in reverse (blocking) direction. Only when D has a voltage of about $+\frac{1}{3}$ $U_b$, does the barrier layer between 2 and 1 come into the forward direction and injects minority carriers into the semiconductor, whereby the region between D and $B_1$ is flooded and made low ohmic. The forward voltage at the p-n junction 1—2 is thereby increased so that even more minority carriers are injected. This behavior is unstable, which is expressed by the occurrence of a region of negative input resistance. The minority carriers are indicated by + signs which move in the direction of the arrow 3 to the base $B_1$. By suitable switching measures, this can be utilized for instance to produce a sawtooth curve.

An arrangement described with reference to FIG. 1, which operates with a semiconductor body that has not been constructed according to the invention has however the disadvantage of only slight voltage carrying capacity. Furthermore, only small power can be obtained from the trigger circuit. Therefore substantial limits are placed on the application of the double-base diode—particularly as switch. An object of the invention is to overcome this drawback.

Another known device which operates essentially similarly is the double-base transistor which is shown schematically in FIG. 2. The designations correspond to those applied in FIG. 1. The difference as compared with the double-base diode in accordance with FIG. 1 is that in addition to the alloy layer 2 which operates as emitter, there is arranged opposite it a corresponding alloy layer 4 so that an emitter electrode E and a collector electrode V are disposed opposite each other along the same level. This arrangement may be used for the same purposes as indicated in connection with FIG. 1. The arrangement however has also the disadvantage of a low efficiency since the greatest part of the minority carriers injected by the emitter must flow to a base in order to produce a steep negative characteristic and only a small part passes into the collector. This also is true when the semi-conductor body according to FIG. 2 has an interior field in accordance with the invention so far described.

In accordance with a further feature of the invention, the arrangements shown in FIGS. 1 and 2 may be improved so as to produce very clearly developed different stability positions of the current-voltage characteristic between the emitter and base $B_1$ by staggering the emitter and collector with respect to each other in the direction of the line connecting the two base terminals $B_1$ and $B_2$. The staggering should be as large as possible so that the barrier layers of the emitter and collector do not overlap. This condition is clearly fulfilled for instance when both electrodes are arranged on the same side of the semiconductor crystal.

FIGS. 3*a* and 3*b* in which there are schematically shown the semiconductor arrangement embodying such further feature of the invention, will serve to explain the operation. In FIG. 3*a* the emitter and collector electrodes are arranged on the same side of the semi-conductor crystal; however in principle they may also be arranged obliquely opposite each other as indicated in FIG. 3*b*. Their distance apart may be about one order of magnitude—or even more—larger than the customary base width in transistors. This is intended to mean that the corresponding value, that is, the spacing between emitter and collector is greater than the reference value, namely, greater than the width of the base in junction transistors. The spacing between emitter and collector may be 10 times the customary width of the base. Numeral 1 again indicates a semiconductor crystal bar of n-conductive germanium of large diffusion length and high resistance of at least 10 ohm-centimeters, in the example 20 to 30 ohm-centimeters. E and C designate emitter and collector electrodes which are produced by the incorporation of the indium-containing layers 2 and 4 into the germanium crystal. A voltage $U_b$ of 10 volts is applied to the two base terminals $B_1$ and $B_2$. At the emitter there is a voltage of +7 volts and at the collector −60 volts with respect to the grounded base $B_1$. In the case of the use of silicon as semiconductor, considerably greater resistances of up to a few hundred ohm-centimeters are advantageous.

The manner of operation of the device is as follows: The minority carriers injected by the emitter at the moment of the reversal into the region located between it and the base $B_1$ reduce the resistance of the semiconductor in this region and thereby produce the instability. If the collector were not present, they would again disappear in the base terminal $B_1$. In the case of a double-base transistor, in accordance with a further object and feature of the invention, the minority carriers serve to control the p-n junction of the collector C lying in the reverse direction after passing through a certain region between the emitter E and $B_1$. As soon, namely, as the minority carriers due to the field lying between $B_1$ and $B_2$ are moved in the direction toward $B_1$, thereby making the region between E and C of low ohmic value and the current-voltage characteristic between E and $B_1$ unstable, they are collected by the collector C lying in the reverse (blocking) direction, whereby its p-n junction is controlled. The outer resistance in the collector circuit may be matched to the inner resistance by means of the resistor 5.

The arrangement acts as trigger mechanism, the stability of which is considerably greater than that of the known arrangements, as shown in FIGS. 1 and 2. In particular the efficiency is also greater than for instance in the arrangement in accordance with FIG. 1 since practically all minority carriers which cause the triggering also feed the working resistor 5 while in the arrangement in accordance with FIG. 1 the minority carriers are split into two parts, one of which flows toward $B_1$ for the triggering while only the other part enters into the collector and from there into the working resistance.

For cooling, the electrode-free side of the semiconductor bar is preferably applied in a good heat conductive manner with the interposition of a thin electric insulating layer to a base, for instance of copper, which carries the heat away well, being for instance cemented to same.

Another embodiment of the invention is concerned with a multiple arrangement of the described device for widening the range of application, particularly for the production of flip-flop trigger operations. Such flip-flop operations were heretofore produced by circuits employing tubes or transistors of known construction. This may also be accomplished by means of the double-base transistor in accordance with the invention, namely, by connecting a double-base transistor, the emitter and collector electrodes of which are staggered with respect to each other in the direction of the line connecting the two base terminals, in parallel with a second, substantially similar structural element forming a single structural and/or circuit unit in which two resistance-capacitance combinations, each of which is connected in series with one of the two emitters, are connected via a common ohmic resistance to a common voltage source that at all times only one of the two emitters can lie in the forward direction but the other emitter must lie in the reverse (blocking) direction. If the two common base terminals of this device are fed with a voltage pulse of a suitable value, the emitter terminal which was previously in the reverse direction changes its polarity into the forward direction while the emitter terminal which was previously in the forward direction changes its polarity to the reverse direction. Upon each further pulse, the cycle is repeated in opposite sense.

In FIGS. *5a* to *8b* there are shown a few examples of a device in accordance with the invention.

FIGS. *5a* and *5b* show flip-flop circuits with two separate double-base structural elements. The resistor $R_3$ is sufficiently large so that at all times only one p-n junction $D_1$ or $D_2$ serving as emitter can lie in the forward direction. If both p-n terminals lie in the forward direction, the voltage drop at $R_3$ is so great due to the doubled current that the potential of point A drops greatly and one p-n terminal flips into the blocking direction. $B_1$ and $B_2$ and $B_1'$ and $B_2'$ respectively are the two parallel connected base pairs of the two semiconductor bars H and H'.

The operation of the arrangement is as follows:

It is assumed that the p-n electrode $D_1$ lies in the forward direction and that a current of about 2 milliamperes flows. $D_2$ lies in blocking direction. In FIG. 6 there is shown a voltage current characteristic which may apply to both emitter-base systems. On the voltage axis V is plotted the potential P of point A. The oblique resistance line *x* corresponds to the resistors $R_1$ and $R_2$. Their point of intersection I with the characteristic gives the stable working point of the p-n terminal $D_2$ lying in the forward or pass direction. The point of intersection II represents the stable operating point of the p-n terminal $D_2$ lying in the blocking direction.

If a pulse is conducted only to the input of the transformer U, the positive potential of $B_2$ and $B_2'$ (FIG. 5) will temporarily be lowered. As a result, $D_2$ also flips over into the forward direction. The forward current which sets in finds discharged capacitor $C_2$ and flows first of all through it until the capacitor is charged. During the charging of $C_2$, $D_2$ has an approximately horizontal resistance line Y (FIG. 6) since the current does not flow through $R_2$ but through $C_2$. The operating point of $D_2$ would be at the point of intersection III. Due to the increased current $R_3$, the potential P of point A drops to P' (FIG. 6). The resistance lines *y* and *y'* are accordingly displaced toward *x* and *x'*. *x'* still supplies only a stable operating point IV in the blocking region. $D_1$ therefore flips into the blocking direction; *y'* as before supplies a stable operating point V in the forward region. $D_2$ therefore remains in the forward direction. Since $D_1$ has flipped over into the blocking direction, P' moves toward P. The charging of $C_2$ now proceeds to the end. The inclination of *y* becomes steeper and finally passes into *x*. In stationary state after the first pulse $D_2$ conversely is now in the forward direction, $D_1$ in the reverse direction. The working point of $D_2$ is now at I and of $D_1$ at II.

In addition to the previously mentioned parts of the device, as shown in FIG. *5b*, there may also be provided collectors $K_1$ and $K_2$ on the semiconductor bars H and H' to which negative bias is applied over resistors $R_4$ and $R_5$. However, the device in accordance with the invention fundamentally produces the desired flip-flop processes even without the resistors $R_4$ and $R_5$. The collectors have a negative voltage of 50 volts, while to the two emitters there is applied over the resistor $R_3$ a common bias of +50 volts and the base terminals $B_2$ and $B_2'$ are at a voltage of 20 volts over the transformer U.

In FIGS. *7a* to *8b* there are shown by way of example embodiments in which the two double-base structural elements are combined into a common single semiconductor body. Parts in these figures are referenced as in FIGS. *5a* and *5b*. The emitter and collector terminals are incorporated in a common semiconductor body. They could also—at least in part—be made in the form of point contacts. The semiconductor body has in accordance with FIGS. *7a* and *7b* the form of a small generally rectangular wafer the opposite longitudinal sides of which are contacted free of barrier with the base terminals $B_1$ and $B_2$. In the embodiments shown in FIGS. *8a* and *8b*, the semiconductor body has an elongated generally bar-shape with a common center base $B_1$. This may be effected for instance by producing initially two separate bars the base contacts $B_1$ of which are placed together or otherwise combined with each other. Another possibility resides in producing a common continuous semiconductor bar which is covered at place $B_1$ with a barrier-free electrode on the surface. $B_1$ and $B_2$ as well as emitter D and collector K may be interchanged with each other.

As semiconductive material germanium or even better silicon are particularly well suited, but other semiconductive substances with large diffusion lengths, such as for instance $A^{III}B^{V}$-compounds, are also suitable. The semiconductive material used should be of as high ohmic value as possible which for instance in the case of germanium has 20 to 30 ohm-centimeters or in the case of silicon several hundred ohm-centimeters. The resistance value may be brought close to the limit of the conductivity of the corresponding material. It may be pointed out that the barrier layer contacts of the emitter and/or collector may be produced differently and in particular may be formed as marginal barrier layers.

Changes may be made within the scope and spirit of the appended claims.

I claim:

1. In semiconductor device for switching purposes having a semiconductor body provided with two barrier-free electrodes and at least one blockable emitter electrode, and having two base electrodes which are adapted to be at different potential and wherein the emitter electrode is adapted to be in one stable condition of its current-voltage characteristic at a potential which blocks the emitter current, and wherein minority carriers are injected into the semiconductor body in the other stable condition of the emitter; the improvement which comprises constructing the semiconductor body and the two base electrodes cooperating therewith so that the strength of the electrical field produced in the semiconductor body by the bias of the base electrodes, whereby the minority carriers injected by the emitter are moving in the direction of one base electrode, increases in the direction of the flow of the minority carriers.

2. A semiconductor device according to claim 1, comprising two base electrodes of different formation.

3. A semiconductor device according to claim 1, comprising a semiconductor body having a cross-section which is reduced in the direction of the minority carrier flow, the decrease of the cross-section varying in accordance with a predetermined function.

4. A semiconductor device according to claim 1, comprising a semiconductor body having a cross-section which is stepwise reduced in the direction of the minority carrier flow, the decrease of the cross-section varying in accordance with a predetermined function.

5. A semiconductor device according to claim 1, comprising a semiconductor body carrying on its surface along the path of increasing field strength a coating.

6. A semiconductor device according to claim 1 comprising a semiconductor body carrying on its surface along the path of increasing field strength a coating forming at least in part a p-n junction.

7. A semiconductor device according to claim 1, comprising a semiconductor body carrying on its surface along the path of increasing field strength a coating forming at least in part a marginal layer.

8. A semiconductor device according to claim 1, comprising a semiconductor body carrying on its surface along the path of increasing field strength a coating forming at least in part a collector.

9. A semiconductor device according to claim 1, comprising a semiconductor body having in the direction of minority carrier flow zones of predetermined doping.

10. A semiconductor device according to claim 1, comprising a semiconductor body made of a material the band width of which varies in the direction of the minority carrier flow.

11. A semiconductor device according to claim 1, wherein said emitter electrode and an additional collector electrode are disposed staggered with respect to each other.

12. A semiconductor device according to claim 1, wherein said emitter electrode and an additional collector electrodes are disposed staggered with respect to each other, the amount of staggering being such that overlapping of barrier layers is excluded.

13. A semiconductor device according to claim 1, wherein said emitter electrode and an additional collector are disposed staggered with respect to each other, the amount of staggering providing a spacing between said electrodes which exceeds at least by one order of magnitude the customary base width of junction transistors.

14. A semiconductor device according to claim 1, wherein said emitter electrode and an additional collector electrodes are disposed on opposite sides of said semiconductor body.

15. A semiconductor device according to claim 1, wherein one of said base electrodes and said collector electrode are disposed alongside each other on one side of said semiconductor body.

16. A semiconductor device according to claim 1, comprising a semiconductor body made of a material which presents to the motion of the charge carriers a frictional resistance as low as possible.

17. A semiconductor device according to claim 1, comprising a thermal conductor in electrically insulating and good heat conducting engagement with at least part of a side of said semiconductor.

18. A semiconductor device according to claim 1, comprising two semiconductor bodies each carrying an emitter and a collector electrode disposed staggered with respect to each other and forming a structural unit, means for connecting components of said unit in parallel relationship, resistance-capacitance combinations connected respectively in series with said emitter electrodes, a common resistor connected with said resistance-capacitance combinations, and a voltage source connected with said resistor, only one emitter serving as p-n junction lying at any time in forward direction and the other emitter serving also as p-n junction lying at such time in reverse direction.

19. A semiconductor device according to claim 1, comprising a semiconductor body made in the form of a generally rectangular plate, the opposite longitudinal sides of said body carrying said base electrodes, emitter and collector electrode means being disposed respectively alongside on said body in the direction of the extent of said base electrodes.

20. A semiconductor device according to claim 1, comprising a generally bar-shaped semiconductor body, a base electrode disposed at each end of said body, said base electrodes being connected in parallel, a common centrally disposed base electrode, and emitter-collector electrode means disposed on said body in each section thereof extending from said common base electrode.

21. A semiconductor device according to claim 1, comprising a semiconductor body made of a material having due to weak doping a relatively high resistance values lying close below the natural conductance limit.

References Cited in the file of this patent

UNITED STATES PATENTS

| | | |
|---|---|---|
| 2,600,500 | Haynes et al. | June 17, 1952 |
| 2,761,020 | Shockley | Aug. 28, 1956 |
| 2,769,926 | Lesk | Nov. 6, 1956 |
| 2,801,340 | Keonjian et al. | July 30, 1957 |
| 2,801,348 | Pankove | July 30, 1957 |
| 2,814,735 | Cody et al. | Nov. 26, 1957 |
| 2,829,075 | Pankove | Apr. 1, 1958 |
| 2,832,898 | Camp | Apr. 29, 1958 |
| 2,835,613 | Haayman | May 20, 1958 |
| 2,836,797 | Ozarow | May 27, 1958 |

OTHER REFERENCES

The Field-Effect Transistor by Ross in "Bell Laboratories Record," May 1955, pages 167–172.